United States Patent
Laine et al.

(10) Patent No.: US 9,960,251 B2
(45) Date of Patent: May 1, 2018

(54) ESD PROTECTION STRUCTURE AND METHOD OF FABRICATION THEREOF

(71) Applicant: Freescale Semiconductor, Inc., Austin, TX (US)

(72) Inventors: Jean Philippe Laine, Saint Lys (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 14/829,961

(22) Filed: Aug. 19, 2015

(65) Prior Publication Data

US 2016/0276460 A1 Sep. 22, 2016

(30) Foreign Application Priority Data

Mar. 19, 2015 (WO) .................. PCT/IB2015/000535

(51) Int. Cl.
*H01L 23/62* (2006.01)
*H01L 29/72* (2006.01)
(Continued)

(52) U.S. Cl.
CPC .... *H01L 29/66371* (2013.01); *H01L 27/0255* (2013.01); *H01L 27/0259* (2013.01);
(Continued)

(58) Field of Classification Search
CPC ......... H01L 2924/0002; H01L 2924/00; H01L 27/0259; H01L 27/0262; H01L 27/0251;
(Continued)

(56) References Cited

U.S. PATENT DOCUMENTS 6,268,630 B1 7/2001 Schwank et al.
8,390,092 B2 3/2013 Gendron et al.
(Continued)

FOREIGN PATENT DOCUMENTS

WO 2014041388 A1 3/2014

OTHER PUBLICATIONS

Restriction Requirement dated May 4, 2016 for U.S. Appl. No. 14/830,038, 7 pages.
(Continued)

*Primary Examiner* — Bradley K Smith
*Assistant Examiner* — David Goodwin

(57) ABSTRACT

An ESD protection structure comprising a first semiconductor region of a first doping type, a second semiconductor region of the first doping type, a semiconductor structure of a second doping type opposite to the first doping type formed to provide lateral isolation between the first and second semiconductor regions of the first doping type, and a first contact region of the second doping type formed within a surface of the second semiconductor region. A thyristor structure is formed within the ESD protection structure comprising the first contact region of the second doping type, the second semiconductor region of the first doping type, the semiconductor structure of the second doping type, and the first semiconductor region of the first doping type. Wherein no contact region is formed within a surface of the semiconductor structure of the second doping type between the first and second semiconductor regions of the first doping type.

14 Claims, 8 Drawing Sheets

(51) Int. Cl.
    *H01L 29/66*     (2006.01)
    *H01L 29/06*     (2006.01)
    *H01L 29/74*     (2006.01)
    *H01L 27/02*     (2006.01)

(52) U.S. Cl.
    CPC ...... *H01L 27/0262* (2013.01); *H01L 29/0642* (2013.01); *H01L 29/7404* (2013.01); *H01L 29/7424* (2013.01)

(58) Field of Classification Search
    CPC ............. H01L 29/7436; H01L 29/0821; H01L 29/735; H01L 27/0248
    See application file for complete search history.

(56) References Cited

U.S. PATENT DOCUMENTS

| | | | | |
|---|---|---|---|---|
| 8,680,621 | B2* | 3/2014 | Besse | H01L 27/0259 257/173 |
| 9,018,072 | B2 | 4/2015 | Gendron et al. | |
| 9,431,389 | B2* | 8/2016 | Hwang | H01L 27/0259 |
| 2002/0066929 | A1* | 6/2002 | Voldman | H01L 27/0251 257/355 |
| 2004/0021169 | A1 | 2/2004 | Leonardi | |
| 2004/0217425 | A1* | 11/2004 | Brodsky | H01L 27/0248 257/360 |
| 2005/0207077 | A1 | 9/2005 | Xu et al. | |
| 2008/0308837 | A1 | 12/2008 | Gauthier, Jr. et al. | |
| 2009/0213506 | A1 | 8/2009 | Zhan et al. | |
| 2010/0171149 | A1* | 7/2010 | Denison | H01L 29/7436 257/173 |
| 2011/0176243 | A1 | 7/2011 | Zhan et al. | |
| 2011/0186909 | A1 | 8/2011 | Tsai et al. | |
| 2012/0119331 | A1 | 5/2012 | Gendron et al. | |
| 2013/0328125 | A1* | 12/2013 | Ho | H01L 27/0285 257/355 |
| 2014/0061716 | A1 | 3/2014 | Zhan et al. | |
| 2014/0225156 | A1 | 8/2014 | Zhan et al. | |
| 2015/0187749 | A1* | 7/2015 | Dai | H01L 29/7436 257/173 |
| 2016/0276332 | A1 | 9/2016 | Laine et al. | |

OTHER PUBLICATIONS

Non-Final Office Action dated Jul. 26, 2016 for U.S. Appl. No. 14/830,038, 12 pages.
Final Office Action dated Dec. 13, 2016 for U.S. Appl. No. 14/830,038, 12 pages.
Non-Final Rejection Office Action dated Oct. 26, 2017 for U.S. Appl. No. 14/830,038, 13 pages.

\* cited by examiner

US 9,960,251 B2

ESD PROTECTION STRUCTURE AND METHOD OF FABRICATION THEREOF

FIELD OF THE INVENTION

This invention relates to an electrostatic discharge protection structure and a method of fabrication thereof.

BACKGROUND OF THE INVENTION

Integrated circuit (IC) devices are prone to electrostatic discharge (ESD) events, whereby external contacts of the IC devices are subjected to large electrical charges (positive or negative). Functional circuitry within an IC device is required to be protected from electrical currents created by such large electrical charges at the external contacts of the IC devices, which can cause erroneous behavior within the functional circuitry and even permanently damage the functional circuitry due to the magnitude of the electrical currents that can be generated by ESD events.

To protect the functional circuitry of an IC device from ESD events, it is known to provide susceptible external contacts of the IC device with ESD protection structures. Conventional ESD protection structures typically include thyristor structures (i.e. P-N-P-N semiconductor structures) coupled between an external contact to be protected, such as an input/output (I/O) contact of the IC device, and a power supply contact (e.g. ground or Vss) to which ESD currents are to be shunted.

Silicon on insulator (SOI) technology refers to the use of a layered silicon-insulator-silicon substrate in place of conventional silicon substrates in semiconductor manufacturing, especially microelectronics, to reduce parasitic device capacitance, thereby improving performance. SOI-based devices differ from conventional silicon-built devices in that the silicon junction is above an electrical insulator such as silicon dioxide.

Conventional ESD protection structures have been found to have poor robustness against prolonged ESD gun stress tests when implemented with SOI technology due to current focalization causing hotspots within the ESD protection structures, and often do not meet ESD requirements for automotive applications and the like, for example the 2 k/330 pF gun model and the required +/−8 kV gun stress target.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some examples of the present invention, there is provided an electrostatic discharge protection structure having a thyristor arrangement within which a doped semiconductor structure is arranged to provide a diode-collector node during an electrostatic discharge event. No contact region is formed within a surface of the doped semiconductor structure providing the diode-collector node. In this manner, a resistive path is provided between the diode-collector nodes of neighboring cells within the thyristor structure. Such a resistive path between diode-collector nodes of neighboring cells means that the voltages at the diode-collector nodes of the neighboring cells are not clamped together. As a result, and as described in greater detail below, avalanche breakdown is able to occur more easily within the transistor structures of the neighboring cells, thereby reducing the likelihood of an electrostatic discharge current flowing through the electrostatic discharge protection structure becoming focused at a small number of points along the electrostatic discharge protection structure.

Figure 1:
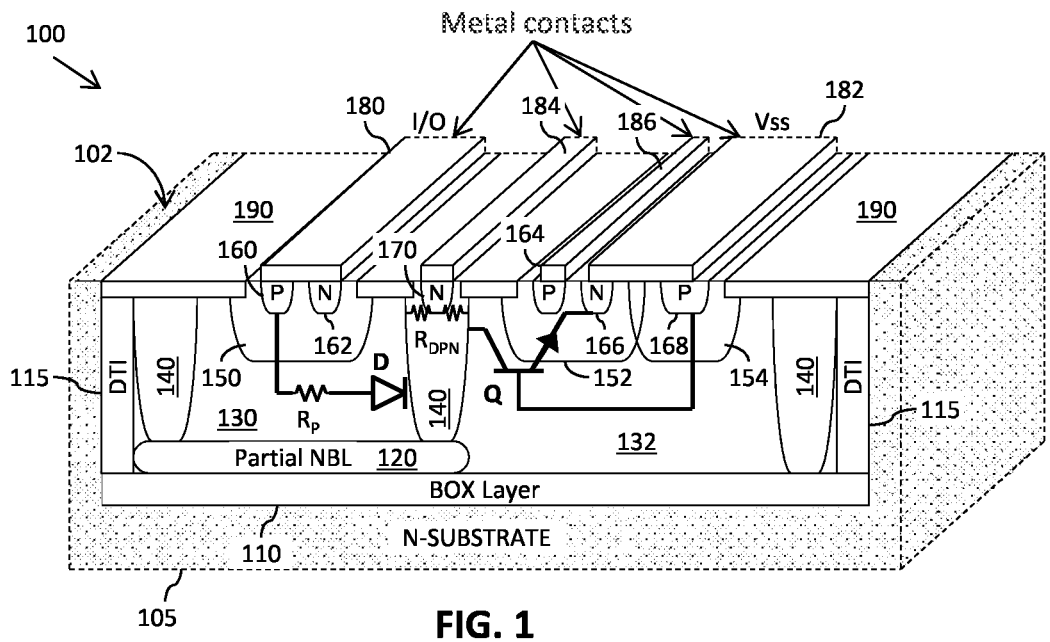
FIG. 1 schematically illustrates a conventional ESD protection structure formed within a surface of a semiconductor substrate.

FIG. 1 schematically illustrates a conventional ESD protection structure 100 formed within a surface 102 of a semiconductor substrate 105. The ESD protection structure 100 illustrated in FIG. 1 includes a P-doped epitaxial layer divided into two regions 130, 132 by a deep N-well (DPN) structure 140.

P-doped wells 150, 152, 154 are formed within the upper surfaces of the two P-doped regions 130, 132 of the epitaxial layer. The use of the term 'upper surface' used herein is intended to refer to a surface of a region or structure (e.g. a P-doped well 150, 152, 154 in this scenario) that is substantially co-planar with the surface 102 of the semiconductor substrate 105 within which the ESD structure 100 is formed.

P-doped contact regions 160, 164, 168 are formed within the upper surfaces of the P-doped wells 150, 152, 154. N-doped contact regions 162, 166 are also formed within the upper surfaces of two of the P-doped wells 150, 152.

A metalized contact layer 180 is formed over the P-doped contact region 160 and the N-doped contact region 162 within the upper surface of the P-doped well 150 of the first region 130 of the epitaxial layer, and arranged to be electrically coupled to a contact (pad) of the IC device to be protected, such as an input/output (I/O) contact.

A metalized contact layer 182 is formed over the P-doped contact region 168 within the upper surface of the P-doped well 154 of the second region 132 of the epitaxial layer and the N-doped contact region 166 within the upper surface of the P-doped well 152 of the second region 132 of the epitaxial layer, and arranged to be electrically coupled to a power supply contact (e.g. ground or Vss) to which ESD currents are to be shunted.

A further metalized contact layer 186 is formed over the P-doped contact region 164 within the upper surface of the P-doped well 152 of the second region 132 of the epitaxial layer. This further metalized contact layer 186 is kept 'floating' (i.e. not coupled to a power supply or other reference voltage).

An N-doped contact region 170 is also formed in the upper surface of the DPN structure 140, between the two P-doped regions 130, 132 of the epitaxial layer. A metalized contact layer 184 is formed over the N-doped contact region 170 between the two regions 130, 132 of the epitaxial layer. The purpose of this N-doped contact region 170 and the metalized contact layer 184 extending along the DPN structure 140 between the two P-doped regions 130, 132 of the epitaxial layer is to aid homogeneous current flow through the ESD protection structure 100 during an ESD event.

As can be seen from FIG. 1, a P-N-P-N thyristor structure is formed within the ESD protection structure 100. Specifically, the thyristor structure is formed from:
the P-doped region 130 of the epitaxial layer, the P-doped well 150 and the P-doped contact region 160;
the N-doped DPN structure 140 (between the first and second P-doped regions 130, 132 of the epitaxial layer);
the second P-doped region 132 of the epitaxial layer and the P-doped well 152; and
the N-doped contact region 166.

During an ESD event whereby a large electrical charge is injected into the (I/O) contact to be protected (coupled to the metalized contact layer 180 in FIG. 1), the P-N-P-N thyristor structure creates a diode D and NPN bipolar transistor Q circuit, as illustrated in FIG. 1. In an ideal circuit, the ESD charge generates a large voltage drop across the collector-base junction of the NPN bipolar transistor Q that exceeds the breakdown voltage of the transistor Q. This results in an avalanche breakdown of the NPN bipolar transistor Q, and causes the NPN bipolar transistor Q to go into a snapback mode of operation whereby a large current is able to flow there through, enabling the ESD charge to be shunted from the (I/O) contact to be protected, through the diode D and transistor Q, to a power supply contact (e.g. Vss) coupled to the metalized contact 182.

Figure 2:
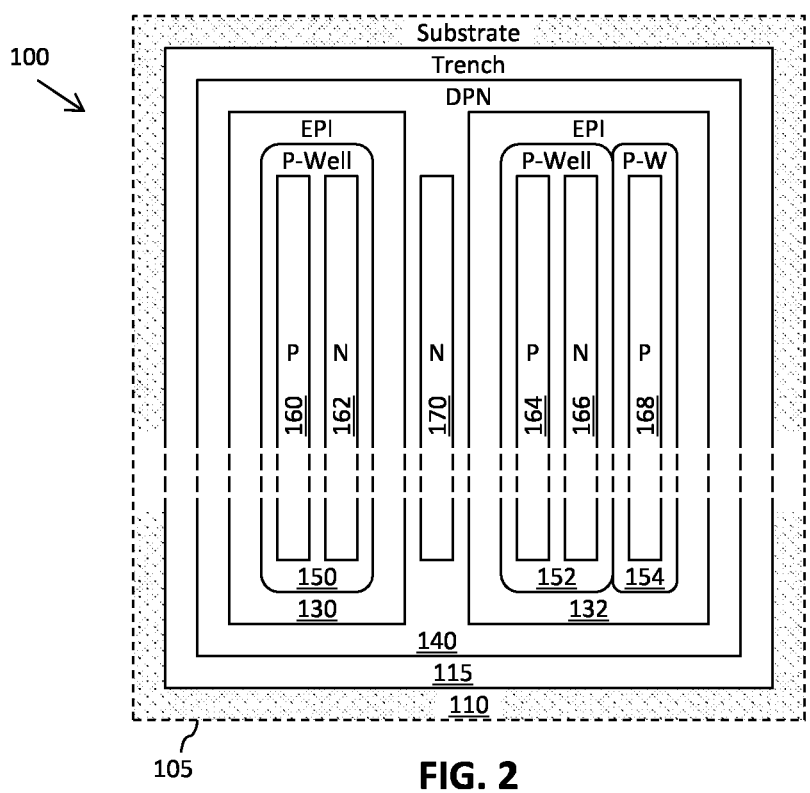
FIG. 2 schematically illustrates a simplified plan view of a typical profile of the known ESD protection structure of FIG. 1.
Figure 3:
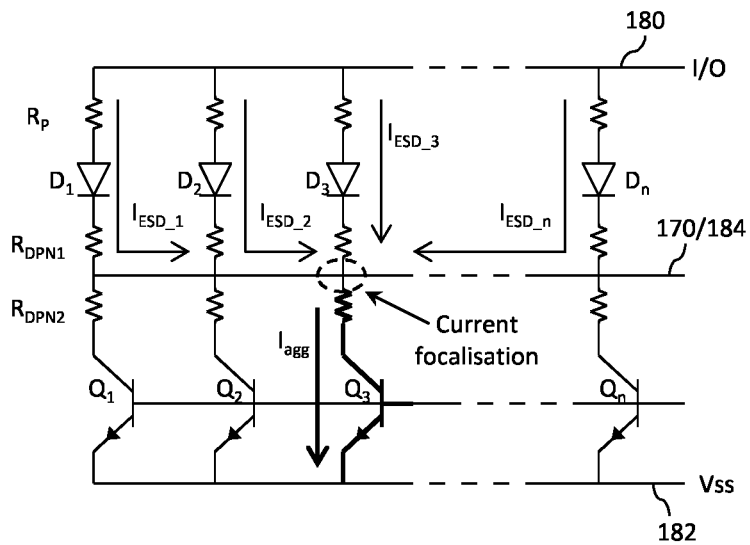
FIG. 3 illustrates a simplified circuit diagram of a plurality of diode and NPN bipolar transistor cells representing the behavior of a thyristor structure within the known ESD protection structure of FIG. 1 during an ESD event.

FIG. 2 schematically illustrates a simplified plan view of a typical profile of the known ESD protection structure 100 of FIG. 1. For clarity, the metalized contact layers 180, 182, 184 (and shallow trench isolation layers 190) have been omitted from FIG. 2 so as not to obscure the view of the other components of the ESD structure 100. As can be seen more clearly from FIG. 2, the contact regions 160, 162, 164, 166, 168, 170 and P-doped wells 150, 152, 154 consist of long, narrow formations running in parallel within the ESD protection structure 100. Because of the long, narrow nature of these formations within the ESD protection structure 100, the behavior of the ESD protection structure 100 may be represented by a plurality of thyristor 'cells' coupled in parallel. During an ESD event, whereby a large electrical charge is injected into the (I/O) contact to be protected, the thyristor cells behave as a plurality of diode D and NPN bipolar transistor Q cells coupled in parallel, as illustrated in FIG. 3.

As described above, the purpose of this N-doped contact region 170 and the metalized contact layer 184 extending along the DPN structure 140 between the two P-doped regions 130, 132 of the epitaxial layer is to aid homogeneous current flow through the ESD protection structure 100 during an ESD event. As illustrated in FIG. 3, the N-doped contact region 170 and the metalized contact layer 184 provide a low-resistance path between the plurality of diode D and NPN bipolar transistor Q cells. This low-resistance path runs between 'diode-collector' nodes of neighboring cells, the term 'diode-collector' node used in this context referring to the node within a cell between the diode device and the collector of the NPN bipolar transistor device.

The inventors have recognized that this low-resistance path between the cells is a significant contributory factor of current focalization within the ESD protection structure 100 during prolonged ESD events. The low-resistance path between the diode-collector nodes of neighboring cells means that the voltages at the diode-collector nodes of the neighboring cells will be substantially uniform. So, in FIG. 3 the voltage at the diode-collector node of the second cell will be substantially equal to the voltage at the diode-collector node of the third cell. If an avalanche breakdown of the transistor $Q_3$ in the third cell occurs ahead of the transistors within nearby cells, when the transistor $Q_3$ in that cell goes into its snapback mode of operation a large current is able to flow through the transistor $Q_3$ from the diode-collector node of the third cell to the metalized supply contact layer 182. As such, the voltage at the diode-collector node of the third cell will become approximately equal to $Vss+(I_{agg}*R_{DPN2})$, where $I_{agg}$ is the current flowing through the transistor $Q_3$ and $R_{DPN2}$ is the ballast resistance between the diode-collector node and the transistor $Q_3$ in the third cell.

As outlined above, the voltages at the diode-collector nodes of the neighboring cells will be clamped to the voltage at the diode-collector node of the third cell due to the low-resistance path between the cells. However, because of the typically low value of the ballast resistance $R_{DPN2}$, an excessively large current $I_{agg}$ is required to achieve a sufficiently high voltage at the diode-collector nodes of the cells to exceed the breakdown voltages of the transistors $Q_1$, $Q_2$, $Q_n$ in the neighboring cells, preventing the transistors in neighboring cells from being forced into snapback mode. As a result, ESD currents ($I_{ESD}$) from the neighboring cells are 'funneled' along the low-resistance N-doped contact region 170 and the metalized contact layer 184 to the transistor $Q_3$ that has gone into snapback mode, and through that transistor $Q_3$ to the metalized supply contact layer 182. Consequently, a large proportion of the ESD current $I_{ESD}$ flowing through the ESD protection structure 100 can become focused at points along the ESD protection structure 100. This current focalization induces a thermal energy focalization within the ESD protection structure 100, resulting in 'hot spots' that can cause a destructive failure of the ESD protection structure 100.

Figure 4:
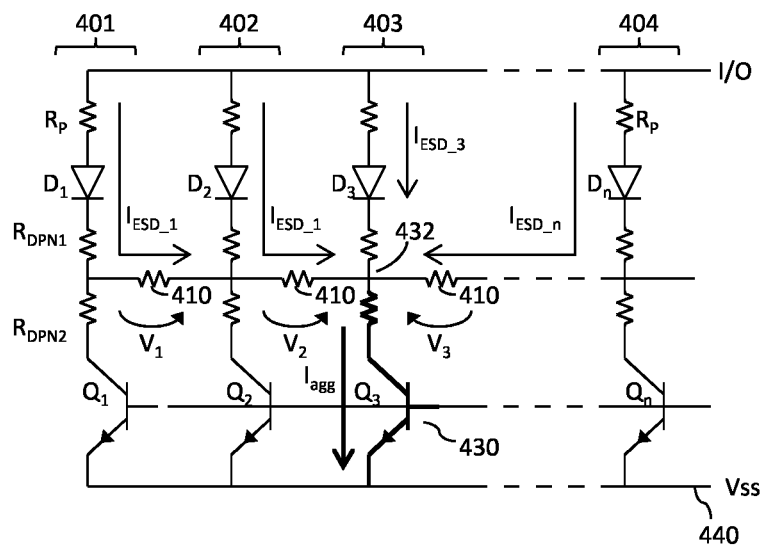
FIG. 4 illustrates a simplified circuit diagram of a plurality of diode and NPN bipolar transistor cells representing the behavior of a thyristor structure within an ESD protection structure according to some examples of the present invention during an ESD event.

FIG. 4 illustrates a simplified circuit diagram of a plurality of diode D and NPN bipolar transistor Q cells 401-404 representing the behavior of an ESD protection structure according to some examples of the present invention during an ESD event whereby a large electrical charge is injected into a contact to be protected. In the example illustrated in FIG. 4, a resistive path is provided between the diode-collector nodes of neighboring cells 401-404, represented by resistances 410 in FIG. 4. In this manner, a potential difference V is created between diode-collector nodes of neighboring cells when current is drawn from one cell to another. Advantageously, such a resistive path 410 between diode-collector nodes of neighboring cells means that the voltages at the diode-collector nodes of the neighboring cells are not so strongly clamped to the voltage at the diode-collector node of a cell containing a transistor in snapback mode. As a result, avalanche breakdown is able to occur more easily within the transistors of the neighboring cells, thereby reducing the likelihood of an ESD current flowing through the ESD protection structure becoming focused at a small number of points along the ESD protection structure.

For example, if an avalanche breakdown of, say, the transistor $Q_3$ 430 in the third cell 403 occurs ahead of the transistors within nearby cells, and the transistor $Q_3$ 430 in that cell 403 goes into its snapback mode of operation, a large current is able to flow through the transistor $Q_3$ 430 from the diode-collector node 432 of the third cell 403 to a power supply 440 (e.g. Vss). As such, the voltage at the diode-collector node 432 of the third cell 403 will become approximately equal to Vss+($I_{agg}$*$R_{DPN2}$), where $I_{agg}$ is the current flowing through the transistor $Q_3$ 430 and $R_{DPN2}$ is the ballast resistance between the diode-collector node 432 and the transistor $Q_3$ 430 in the third cell 403.

However, because of the resistive paths 410 between the diode-collector nodes of neighboring cells 401-404, the voltages at the diode-collector nodes of the neighboring cells 401-404 are not clamped to the voltage at the diode-collector node 432 of the third cell 403. When ESD currents ($I_{ESD}$) from the neighboring cells are funneled along the resistive paths 410 to the transistor $Q_3$ 430 that has gone into snapback mode, a voltage difference $V_i$ is created across each resistive path 410 between neighboring cells. This voltage difference $V_i$ across the resistive paths 410 more easily enables a sufficiently high voltage at the diode-collector nodes of the neighboring cells to be achieved that exceeds the breakdown voltages of the transistors Q in those neighboring cells. As a result, the transistors Q in neighboring cells are more easily able to be forced into snapback mode, thus enabling those transistors Q in neighboring cells to more easily provide additional paths for the ESD current to flow to the power supply Vss 440. The provision of resistive paths 410 between the diode-collector nodes of neighboring cells has been found to significantly reduce the occurrence of current focalization within an ESD structure implemented using SOI technology during prolonged ESD gun stress testing compared with the prior art arrangements, and thus significantly reduces the likelihood of a destructive failure of the ESD protection structure occurring during prolonged ESD gun stress testing.

Figure 5:
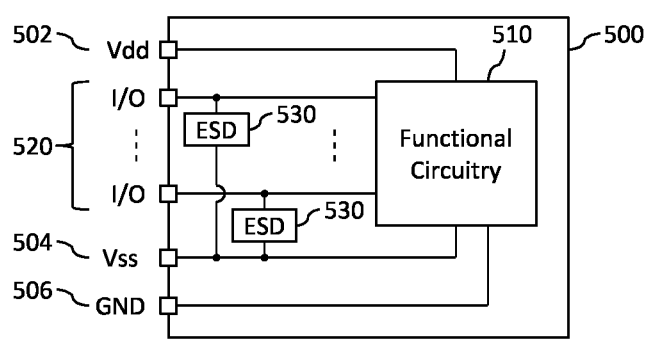
FIG. 5 illustrates a simplified block diagram of an example of an integrated circuit device.

Referring now to FIG. 5, there is illustrated a simplified block diagram of an example of an integrated circuit (IC) device 500. The IC device 500 includes functional circuitry 510 for providing the intended functionality of the IC device. Such functional circuitry 510 may include one or more of, for example:

- combinational logic circuits such as one or more Boolean logic circuits;
- sequential logic circuits;
- processing cores;
- memory elements;
- clock generator circuits;
- power management units;
- interconnect components such as a system bus, crossbar switch or the like;
- etc.

The IC device 500 further includes power supply contacts arranged to be coupled to external power supply sources. Three such power supply contacts 502, 504, 506 are illustrated in FIG. 5 for simplicity: one positive voltage power supply contact Vdd 502; one negative voltage power supply contact Vss 504; and one ground supply contact GND 506. However, it will be appreciated that the IC device 500 may include multiple positive or negative voltage power supply contacts 502, 504, as well as multiple ground supply contacts 506. The IC device 500 further includes at least one contact required to be protected from ESD events, such as the input/output (I/O) contacts 520 illustrated in FIG. 5. The IC device 500 further includes at least one ESD protection component 530 coupled between each of the contacts 520 required to be protected from ESD events and at least one of the power supply contacts 502, 504.

Figure 6:
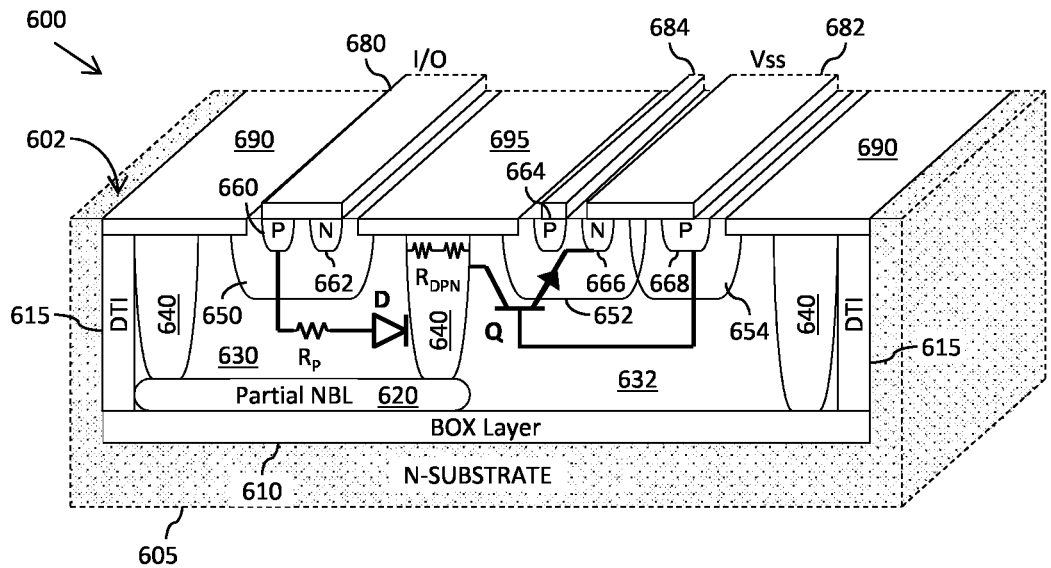
FIG. 6 and FIG. 7 illustrate an example of an ESD protection structure formed within a surface of a semiconductor substrate of an IC device.
Figure 7:
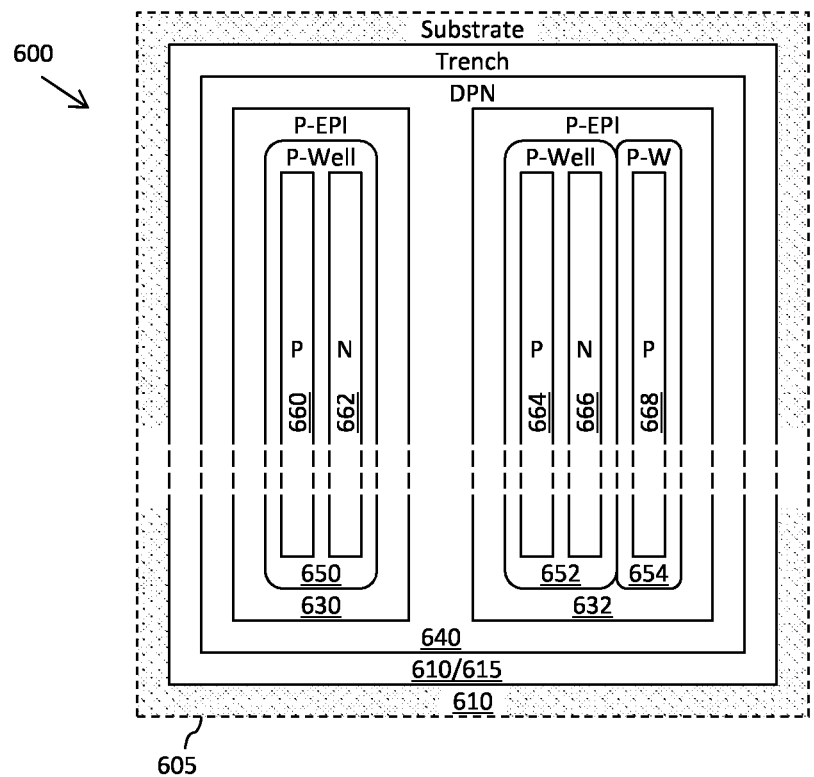

Referring now to FIGS. 6 and 7 there is illustrated an example of an ESD protection structure 600 formed within a surface 602 of a semiconductor substrate 605 of an IC device, such as may be implemented to provide the ESD protection components 530 of the IC device 500 illustrated in FIG. 5. More specifically, FIG. 6 schematically illustrates a perspective cross-sectional view of the ESD protection structure 600 and FIG. 7 schematically illustrates a plan view of the ESD protection structure 600. For clarity, metalized contact layers (680, 682, 684) and shallow trench isolation (STI) layers (690, 695) have been omitted from FIG. 7 so as not to obscure the view of the other components of the ESD structure 600.

The ESD protection structure 600 illustrated in FIGS. 6 and 7 is enclosed within an isolation trench, which isolates the ESD protection structure 600 from the substrate 605. The isolation trench is formed by a buried oxide (BOX) layer 610 forming the 'floor' of the isolation trench, and deep trench isolation (DTI) structures 615 forming the 'walls' of the isolation trench.

The ESD protection structure 600 illustrated in FIGS. 6 and 7 includes a P-doped epitaxial layer divided into two regions 630, 632 by a deep N-well (DPN) structure 640. P-doped wells 650, 652, 654 are formed within the upper surfaces of the two P-doped regions 630, 632 of the epitaxial layer.

P-doped contact regions 660, 664, 668 are formed within the upper surfaces of the P-doped wells 650, 652, 654. N-doped contact regions 662, 666 are also formed within the upper surfaces of two of the P-doped wells 650, 652.

A metalized contact layer 680 is formed over the P-doped contact region 660 and the N-doped contact region 662 within the upper surface of the P-doped well 650 of the first region 630 of the epitaxial layer, and arranged to be electrically coupled to a contact (pad) of the IC device to be protected, such as an input/output (I/O) contact 520 in FIG. 5.

A metalized contact layer 682 is formed over the P-doped contact region 668 within the upper surface of the P-doped well 654 of the second region 632 of the epitaxial layer and the N-doped contact region 666 within the upper surface of the P-doped well 652 of the second region 632 of the epitaxial layer, and arranged to be electrically coupled to a power supply contact (e.g. Vss) to which ESD currents are to be shunted.

In the illustrated example, a further metalized contact layer 684 is formed over the P-doped contact region 664 within the upper surface of the P-doped well 652 of the second region 632 of the epitaxial layer is. This further metalized contact layer 686 is kept 'floating' (i.e. not coupled to a power supply or other reference voltage).

As can be seen from FIGS. 6 and 7, a P-N-P-N thyristor structure is formed within the ESD protection structure 600. Specifically, the thyristor structure is formed from:

the P-doped contact region 660, the P-doped well 650 and the P-doped region 630 of the epitaxial layer;

the N-doped DPN structure 640 (between the first and second P-doped regions 630, 632 of the epitaxial layer);

the second P-doped region 632 of the epitaxial layer and the P-doped well 652; and the N-doped contact region 666.

The conventional ESD protection structure 100 illustrated in FIGS. 1 and 2 includes a contact region 170 having a high dopant concentration formed within the DPN structure 140 between the two regions 130, 132 of the epitaxial layer, and a metalized layer metalized contact layer 184 formed over the contact region 170. As previously mentioned, the purpose of the N-doped contact region 170 and the metalized contact layer 184 within the prior art ESD structure is to aid homogeneous current flow through the ESD protection structure 100 during an ESD event. However, as described above the low-resistance path created between the cells by the N-doped contact region 170 and the metalized contact layer 184 within the prior art ESD structure is a significant contributory factor of current focalization within the ESD protection structure 100 during prolonged ESD events. As such, rather than aiding homogeneous current flow, the inventors have recognized that the N-doped contact region 170 and the metalized contact layer 184 within the prior art ESD structure can in fact be an impediment to homogeneous current flow during prolonged ESD events.

Unlike the conventional ESD protection structure 100 illustrated in FIGS. 1 and 2, no contact region is formed within the DPN structure 640 between the two regions 630, 632 of the epitaxial layer within the ESD protection structure 600 illustrated in FIGS. 6 and 7. Furthermore, no metalized contact layer (184) is formed extending along the DPN structure 640 between the two regions 630, 632 of the epitaxial layer. As a result, no low-resistance path is formed between the two regions 630, 632 of the epitaxial layer. Instead, the lower dopant concentration DPN structure 640 provides resistive paths between the cells of the P-N-P-N thyristor structure. In particular, the lower dopant concentration DPN structure 640 provides resistive paths (410 in FIG. 4) between the diode-collector nodes of the diode D and NPN bipolar transistor Q cells (401 to 404 in FIG. 4) formed during an ESD event, whereby a large electrical charge is injected into the (I/O) contact to be protected. In this manner, and as described above, the voltages at the diode-collector nodes of the neighboring cells are not so strongly clamped to the voltage at the diode-collector node of neighboring cells. As a result, avalanche breakdown is able to occur more easily within the transistors of cells located near to cells with transistors already in snapback mode, thereby reducing the likelihood of current focalization occurring within the ESD protection structure 600 during an ESD event.

In the illustrated example, shallow trench isolation (STI) regions 690, 695 (omitted from FIG. 7 for clarity) are provided on the surface of the ESD protection structure 600 to prevent electrical current leakage between contact regions within adjacent P-doped wells 650, 652, 654, and between the ESD protection structure 600 more generally and the substrate 605. Notably in the illustrated example, an STI layer 695 is formed over the upper surface of the DPN structure 640 between the two regions 630, 632 of the epitaxial layer. Forming such an STI layer 695 over the upper surface of the DPN structure 640 aids in preventing low-resistance paths forming between the diode-collector nodes of the diode D and NPN bipolar transistor Q cells (401 to 404 in FIG. 4).

Thus, in accordance with some examples of one aspect of the present invention there is provided an ESD protection structure formed within a surface of a semiconductor substrate of an integrated circuit device, such as the ESD protection structure 600 hereinbefore described with reference to FIGS. 6 and 7.

The ESD protection structure 600 includes a first semiconductor region of a first doping type, such as the first P-doped region 630 of the epitaxial layer in FIGS. 6 and 7, and at least one further semiconductor region of the first doping type, such as the second P-doped region 632 of the epitaxial layer in FIGS. 6 and 7.

The ESD protection structure 600 further includes a semiconductor structure of a second doping type opposite to the first doping type formed to provide lateral isolation between the first and at least one further semiconductor regions 630, 632 of the first doping type, such as the DPN structure 640 in FIGS. 6 and 7.

The ESD protection structure 600 further includes a first contact region of the second doping type formed within a surface of the at least one further semiconductor region of the first doping type, such as the contact region 666 within the second P-doped region 632 of the epitaxial layer in FIGS. 6 and 7, the surface of the at least one further semiconductor region of the first doping type 632 being substantially co-planar with the surface 602 of the semiconductor substrate 605.

The ESD protection structure 600 is thus arranged such that a thyristor structure is formed within the ESD protection structure including (at least):

the first contact region 666 of the second doping type;

the at least one further semiconductor region 632 of the first doping type containing the first contact region;

the semiconductor structure 640 of the second doping type; and the first semiconductor region 630 of the first doping type.

Significantly, no contact region is formed within a surface of the semiconductor structure 640 of the second doping type between the first and at least one further semiconductor regions 630, 632 of the first doping type. In this manner, no low-resistance path is created running along the semiconductor structure 640 of the second doping type between the first and at least one further semiconductor regions 630, 632 of the first doping type. As such, and as described above, the voltages at the diode-collector nodes of thyristor cells (401-404 in FIG. 4) within the ESD protection structure 600 are not so strongly clamped to the voltage at the diode-collector node of their respective neighboring cells. Accordingly, avalanche breakdown is able to occur more easily within the transistors of cells located near to cells with transistors already in snapback mode, thereby reducing the likelihood of current focalization occurring within the ESD protection structure 600 during an ESD event.

In some examples, an STI layer is formed over the surface of the semiconductor structure 640 of the second doping type between the first and at least one further semiconductor regions of the first doping type 630, 632, such as the STI layer 695 illustrated in FIG. 6. Forming such an STI layer 695 over the surface of the semiconductor structure 640 of the second doping type between the first and at least one further semiconductor regions 630, 632 prevents low-resistance paths forming along the semiconductor structure 640 of the second doping type between the first and at least one further semiconductor regions 630, 632 of the first doping type due to current leakage between the semiconductor structure 640 of the second doping type and nearby contact regions.

In some examples, at least one further contact region of the first doping type is formed within a surface of the at least one further semiconductor region of the first doping type, such as the contact region 660 in FIGS. 6 and 7. Furthermore, in some metalized contact layers may be formed over contact surfaces of the contact regions 660, 666.

In some examples, the first and at least one further semiconductor regions 630, 632 of the first doping type may be formed within an epitaxial layer within the semiconductor substrate 605.

In some examples, doped wells, such as wells 650, 652, 654 in FIGS. 6 and 7, of the first doping type may be formed within the surfaces of the first and at least one further semiconductor regions of the first doping type 630, 632, and the first contact region of the second doping type 666 is formed within a surface of a doped well 652 within the at least one further semiconductor region of the first doping type 632, the surface of the doped well 652 being co-planar with the surface 602 of the semiconductor substrate 605.

In some examples, the semiconductor structure 640 of the second doping type is formed to laterally enclose the first and at least one further semiconductor regions 630, 632 of the first doping type such that the first and at least one further semiconductor regions of the first doping type are laterally isolated from the isolation trench 610, 615.

In some examples, the ESD protection structure 100 further includes a buried layer of the second doping type, such as the NBL 620 in FIG. 6, formed to isolate the first semiconductor region 630 of the first doping type from a floor (e.g. the BOX layer 610) of the isolation trench within which the ESD protection structure 600 is contained, whilst permitting contact between the at least one further semiconductor region 632 of the first doping type and the floor (e.g. BOX layer 610) of the isolation trench.

As hereinbefore described and illustrated in FIGS. 4 to 6, in the illustrated examples the first contact region 666 formed within the surface of the at least one further semiconductor region 632 is arranged to provide a cathode of the thyristor structure within the ESD protection structure 600, whilst the first semiconductor region 630, further contact region 660 and respective P-doped well 650 are arranged to provide an anode of the thyristor structure within the ESD protection structure 600. Furthermore, in the illustrated example, the semiconductor structure of the second doping type, i.e. the DPN structure 640 in FIGS. 6 and 7, is arranged to form the diode-collector node within each thyristor cell during an ESD event.

For completeness, in the illustrated example an N-doped buried layer (NBL) 620 is provided along part of the bottom of the trench as illustrated in FIG. 6 and as described in greater detail below. The DPN structure 640 is formed such that it laterally encloses each of the two P-doped regions 630, 632, creating a floating N-doped structure not connected to any reference potential. The NBL 620 is arranged such that it encloses the bottom of the first P-doped region 630, isolating the first P-doped region 630 from the buried oxide (BOX) layer 610.

As can be seen from FIG. 6, the (silicon) substrate layer 605, (insulator) BOX layer 610 and (silicon) epitaxial/NBL layers 620 form a silicon on insulator (SOI) layered structure (silicon-insulator-silicon). The BOX layer 620 (and the NBL 620 where present) provide vertical (from the cross-sectional perspective illustrated in FIG. 6) isolation between the P-doped regions 630, 632 of the epitaxial layer and the substrate 605. The DPN structure 640 and the DTI structures 615 provide lateral isolation between the individual regions 630, 632 of the epitaxial layer, and between the (P-doped) regions 630, 632 of the epitaxial layer and the (N-doped) substrate 605.

In some examples the P-doped wells 650, 652, will have a P-dopant concentration higher than that of the P-doped epitaxial layer. The second P-doped well 654 within the second region 632 of the epitaxial layer may include a high-voltage P-doped well (HVPW) 654 that has low P-dopant concentration in comparison with the other P-doped wells 650, 652 and the P-doped epitaxial layer (630, 632). The second P-doped well 654 within the second region 632 of the epitaxial layer and the P-doped contact region 664 therein are used to increase the base resistance of transistor Q.

In some examples the contact regions 660, 662, 664, 666, 668 may have a dopant concentration higher than that of the P-doped wells 650, 652, 654.

As will be appreciated by a person skilled in the art, the resistances illustrated in FIG. 4 (including the resistive paths 410 and ballast resistances $R_{DPN1}$, $R_{DPN2}$ and $R_P$) are representative of the resistance to current flow within the semiconductor regions/structures, which is inversely proportional to the conductivity of the respective regions. In general, an increase in doping concentration affords an increase in conductivity due to the higher concentration of carriers available for conduction. Thus, the higher the doping concentration of a particular semiconductor region/structure, typically the higher the conductivity and the lower the resistance of that particular semiconductor region/structure. Conversely, the lower the doping concentration of a particular semiconductor region/structure, typically the lower the conductivity and the higher the resistance of that particular semiconductor region/structure.

Figure 8:
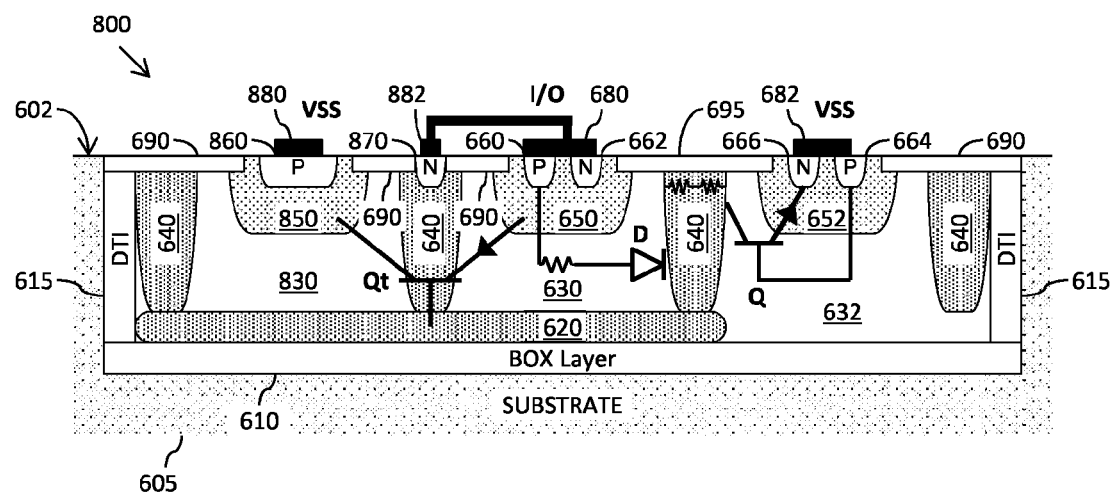
FIG. 8 illustrates an alternative example of an ESD protection structure formed within a surface of a semiconductor substrate of an IC device.

It will be appreciated that the present invention is not limited to the specific ESD protection structure 600 illustrated in FIGS. 6 and 7, and it is contemplated that the present invention may be implemented within various alternative ESD protection structures. FIG. 8 schematically illustrates a simplified cross-sectional view of one example of such an alternative example of an ESD protection structure 800 within which the present invention has been implemented. For ease of understanding, like features have been assigned like reference numerals within FIG. 8 as within FIGS. 6 and 7.

The ESD protection structure 800 illustrated in FIG. 8 is formed within a surface 602 of a semiconductor substrate 605 of an IC device, such as may alternatively be implemented to provide the ESD protection components 530 of the IC device 500 illustrated in FIG. 5. The ESD protection structure 800 illustrated in FIG. 8 is enclosed within an isolation trench, which isolates the ESD protection structure 800 from the substrate 605. The trench is formed of a buried oxide (BOX) layer 610 forming the 'floor' of the trench, and deep trench isolation (DTI) structures 615 forming the 'walls' of the isolation trench.

A P-doped epitaxial layer (630, 632) substantially fills the trench. An N-doped buried layer (NBL) 620 is provided along part of the bottom of the trench as illustrated in FIG. 6 and as described in greater detail below. A deep N-well (DPN) structure 640 is formed within the P-doped epitaxial layer, dividing the epitaxial layer into three regions 630, 632, 830. The DPN structure 640 is formed such that it laterally encloses (and isolates) each of the three regions 630, 632, 830, creating a floating N-doped structure not connected to any reference potential. The NBL 620 is arranged such that it encloses the bottom of two of the regions 630, 830, isolating the two regions 630, 830 from the buried oxide (BOX) layer 610.

As can be seen from FIG. 8, the (silicon) substrate layer 605, (insulator) BOX layer 610 and (silicon) epitaxial/NBL layers 620 form a silicon on insulator (SOI) layered structure (silicon-insulator-silicon). The BOX layer 620 (and the NBL 620 where present) provide vertical (from the cross-sectional perspective illustrated in FIG. 6) isolation between the regions 630, 632, 830 of the epitaxial layer and the substrate 605. The DPN structure 640 and the DTI structures 615 provide lateral isolation between the individual regions 630, 632, 830 of the epitaxial layer, and between the regions 630, 632, 830 of the epitaxial layer and the substrate 605.

P-doped wells 650, 652, 850 are formed within the upper surfaces of the regions 630, 632, 830 of the epitaxial layer. In some examples the P-doped wells 650, 652, 850 will have a P-dopant concentration higher than that of the P-doped epitaxial layer.

A P-doped contact region 660 and an N-doped contact region 662 are formed within the upper surface of the P-doped well 650 of the first P-doped region 630 of the epitaxial layer. A metalized contact layer 680 is formed across the P-doped contact region 660 and the N-doped contact region 662, and arranged to be electrically coupled to a contact (pad) of the IC device to be protected, such as an input/output (I/O) contact 520 of the IC device 500 illustrated in FIG. 5.

A P-doped contact region 664 and an N-doped contact region 666 are formed within the upper surface of the P-doped well 652 of the second P-doped region 632 of the epitaxial layer. A metalized contact layer 682 is formed across the contact regions 664, 666, and arranged to be electrically coupled to a power supply contact, such as the negative power supply contact Vss 504 or a ground contact (not shown) of the IC device 500 illustrated in FIG. 5, to which ESD currents are to be shunted.

In the example illustrated in FIG. 8, a P-doped contact region 860 is formed within the upper surface of the P-doped well 850 of the third P-doped region 830 of the epitaxial layer. A metalized contact layer 880 is formed across the P-doped contact region 860, and arranged to be electrically coupled to a power supply contact, such as the negative power supply contact Vss 504 or a ground contact (not shown) of the IC device 500 illustrated in FIG. 5, to which ESD currents are to be shunted.

In some examples the contact regions 660, 662, 664, 666, 860 have a dopant concentration higher than that of the P-doped wells 650, 652, 850.

As can be seen from FIG. 8, a P-N-P-N thyristor structure is formed within the ESD protection structure 800. Specifically, the thyristor structure is formed from:
  the P-doped contact region 660, the P-doped well 650 and
    the first P-doped region 630 of the epitaxial layer;
  the N-doped DPN structure 640 (between the first and
    second regions 630, 632 of the epitaxial layer);
  the second P-doped region 632 of the epitaxial layer and
    the P-doped well 652; and
  the N-doped contact region 666.

The behavior of the thyristor structure within the ESD protection structure 800 during an ESD event, whereby a large electrical charge is injected into a contact to be protected, may be represented by a plurality of diode D and NPN bipolar transistor Q cells 401-404, as illustrated in FIG. 4.

In the example illustrated in FIG. 8 an N-doped contact region 870 is formed within the DPN structure 640 between the two regions 630, 830 of the epitaxial layer. A metalized contact layer 882 is formed across the N-doped contact region 870, and arranged to be electrically coupled to a contact (pad) of the IC device to be protected, such as an input/output (I/O) contact 520 of the IC device 500 illustrated in FIG. 5. However, as for the ESD protection structure of FIGS. 6 and 7, no contact region (170) having a high dopant concentration is formed within the DPN structure 640 between the two regions 630, 632 of the epitaxial layer. Furthermore, no metalized contact layer (184) is present extending along the DPN structure 640 between the two regions 630, 632 of the epitaxial layer. As a result, no low-resistance path is formed between the two regions 630, 632 of the epitaxial layer. Instead, the lower dopant concentration deep N-well (DPN) structure 640 provides resistive paths between the cells of the P-N-P-N thyristor structure. In particular, the lower dopant concentration deep N-well (DPN) structure 640 provides resistive paths (410 in FIG. 4) between the diode-collector nodes of the diode D and NPN bipolar transistor Q cells (401 to 404 in FIG. 4) formed during an ESD event, whereby a large electrical charge is injected into the (I/O) contact to be protected. In this manner, and as described above, the voltages at the diode-collector nodes of the neighboring cells are not so strongly clamped to the voltage at the diode-collector node of neighboring cells. As a result, avalanche breakdown is able to occur more easily within the transistors of cells located near to cells with transistors already in snapback mode, thereby reducing the likelihood of current focalization occurring within the ESD protection structure 800 during an ESD event.

In the example illustrated in FIG. 8, a second transistor structure Qt is formed within the ESD protection structure by the third P-doped region 830 of the epitaxial layer, and the P-doped well 850 and P-doped contact region 850 therein. This further transistor structure Qt controls the forward triggering of the ESD protection structure 800.

In the illustrated example, shallow trench isolation (STI) regions 690, 695 are provided on the surface of the ESD protection structure 800 to prevent electrical current leakage between contact regions within adjacent P-doped wells 650, 652, 850, and between the ESD protection structure 800 more generally and the substrate 605. Notably in the illustrated example, an STI layer 695 is formed over the upper surface of the DPN structure 640 between the two regions 630, 632 of the epitaxial layer. Forming such an STI layer 695 over the upper surface of the DPN structure 640 prevents low-resistance paths forming between the diode-collector nodes of the diode D and NPN bipolar transistor Q cells (401-404 in FIG. 4)

Figure 9:
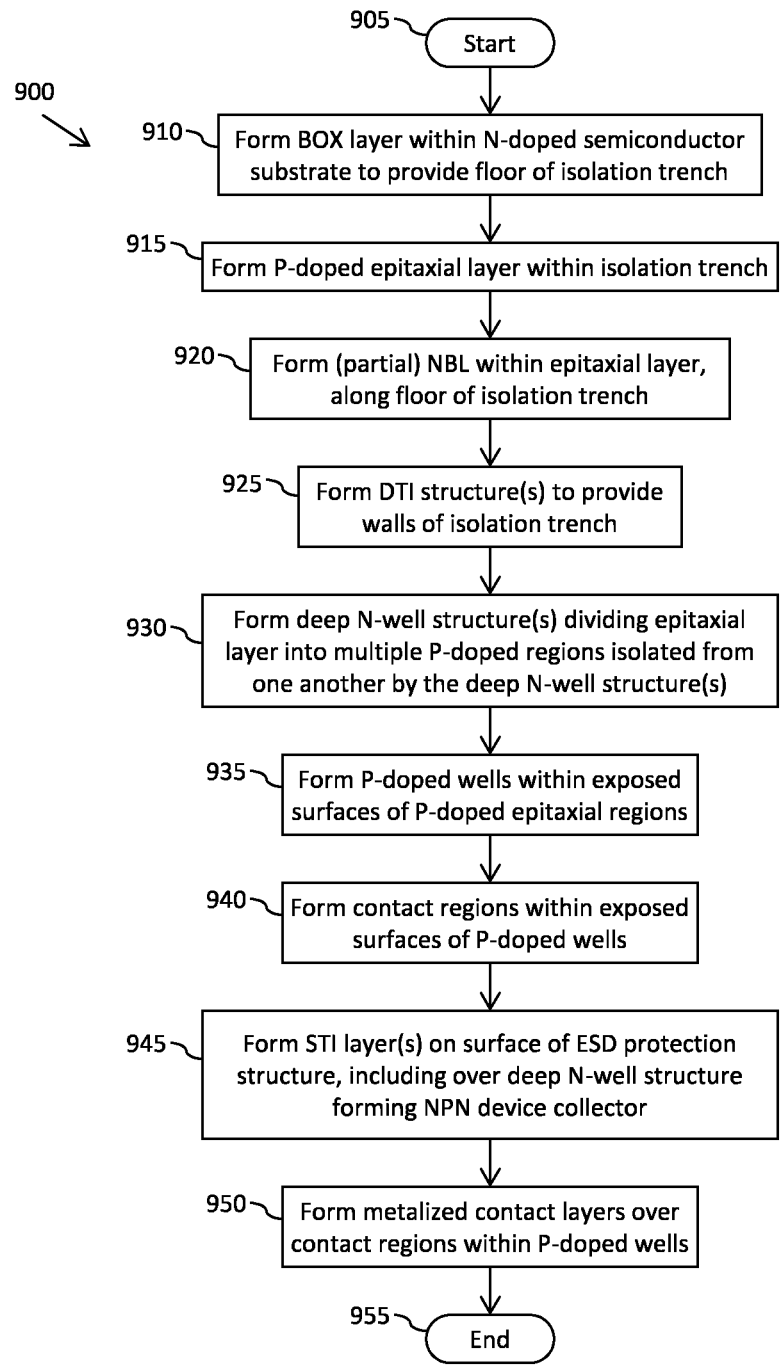
FIG. 9 illustrates a simplified flowchart of an example of a method of fabricating an ESD protection structure within a semiconductor substrate of an integrated circuit device.

Referring now to FIG. 9, there is illustrated a simplified flowchart 900 of an example of a method of fabricating an ESD protection structure within a semiconductor substrate of an integrated circuit device, such as the ESD protection structure 600, 800 illustrated in FIGS. 6 and 7 or FIG. 8. It is to be understood that the simplified flowchart 900 illustrated in FIG. 9 is intended to illustrate general procedures to be performed during the fabrication of the integrated circuit device in order to form the structural components required to implement some examples of the present invention. However, as will be understood by a skilled person, the fabrication process of an integrated circuit device is typically more complex than the simplified flowchart 900 illustrated in FIG. 9, with several of the general procedures illustrated requiring multiple fabrication procedures to be performed at different stages of the fabrication process, and with the implementation of some of the general procedures illustrated in FIG. 9 at least partly overlapping. Furthermore, it will be appreciated that the specific order of the procedures illustrated in FIG. 9 is not intended to be limiting, and the various structural components may be formed in any appropriate order.

The fabrication process illustrated in FIG. 9 starts at 905 and includes the formation of a BOX (buried oxide) layer within the semiconductor substrate, at 910, to provide a floor of an isolation trench within which the ESD protection structure is contained, such as the BOX layers 610 in FIGS. 6 to 8. One known technique for forming the BOX Layer is by way of a Separation by Implantation of Oxygen (SI-MOX) process which uses an oxygen ion beam implantation process followed by high temperature annealing to create a buried SiO2 layer. Alternatively, the BOX layer may be formed by way of wafer bonding, whereby an insulating layer is formed by directly bonding oxidized silicon with a second substrate.

An epitaxial layer is formed within the surface of the semiconductor substrate over the BOX layer, at 915, for example by way of a vapor-phase epitaxy process.

An N-doped buried layer (NBL), such as the NBL 620 in FIGS. 6 to 8, is formed on top of the BOX layer, at 920, for example by way of an N-type dopant implantation procedure. In some examples, the NBL may be a partial N-doped buried layer, whereby a region of the epitaxial layer remains in contact with the BOX layer.

One or more deep trench isolation (DTI) structures are formed, at 925, to provide walls of the isolation trench, for example by way of etching a pattern of the required DTI structure(s) in the semiconductor substrate, depositing one or more dielectric materials (such as silicon dioxide) to fill the trenches, and removing the excess dielectric using a technique such as chemical-mechanical planarization.

One or more deep N-well (DPN) structure(s) is/are formed, at 930, to divide the epitaxial layer into multiple P-doped regions laterally isolated from one another by the DPN structure(s). The NBL formed at 920 is formed to isolate at least a first P-doped region of the epitaxial layer from the BOX layer, such as the P-doped region 630 in FIGS. 6 and 8. In some examples, the NBL formed at 920 is formed such that at least one further P-doped region of the epitaxial layer is in contact with the BOX layer, such as the P-doped region 632 in FIGS. 6 and 8.

In the example illustrated in FIG. 9, P-doped wells are formed within exposed (upper) surfaces of the P-doped regions of the epitaxial layer, at 935, for example by way of a P-type dopant implantation or diffusion procedure.

Contact regions may then be formed within exposed (upper) surfaces of the P-doped wells, for example by way of one or more dopant implantation or diffusion procedure(s). In particular, an N-doped contact region is formed within a surface of a P-doped well within at least one of the P-doped regions of the epitaxial layer such that a thyristor structure is formed within the ESD protection structure, the thyristor structure being formed from:

an N-doped layer including the N-doped contact region;
a P-doped layer including the region of the epitaxial layer and the P-doped well containing the N-doped contact region;
an N-doped layer including a region of the DPN structure between the region of the epitaxial layer containing the N-doped contact region and an adjacent region of the epitaxial layer; and
a P-doped layer including said adjacent region of the epitaxial layer.

In some examples, the N-doped contact region is formed within the region of the epitaxial layer in contact with the BOX layer, such as the region 632 in FIGS. 6 and 8. In some examples, a P-doped contact region is formed within a surface of a region of the epitaxial layer isolated from the BOX layer by the NBL. Significantly, no contact region is formed within the surface of the part of the DPN structure(s) forming the second N-doped layer of the thyristor structure between the region of the epitaxial layer containing the N-doped contact region and the adjacent region of the epitaxial layer.

Shallow trench isolation (STI) layers are formed on the surface of the ESD protection structure, at 945, such that the contact regions are left exposed. In some examples, a shallow trench isolation layer is formed over the surface of the part of the DPN structure(s) forming the second N-doped layer of the thyristor structure between the region of the epitaxial layer containing the N-doped contact region and the adjacent region of the epitaxial layer.

Metalized contact layers are formed over at least some of the contact regions, at 950.

The fabrication process illustrated in FIG. 9 ends at 955

FIGS. 10 to 14 schematically illustrate simplified cross-sectional views of further examples of alternative ESD protection structures within which the present invention has been implemented. For ease of understanding, like features have been assigned like reference numerals within FIGS. 10 to 14 as within FIGS. 6 and 7.

Figure 10:
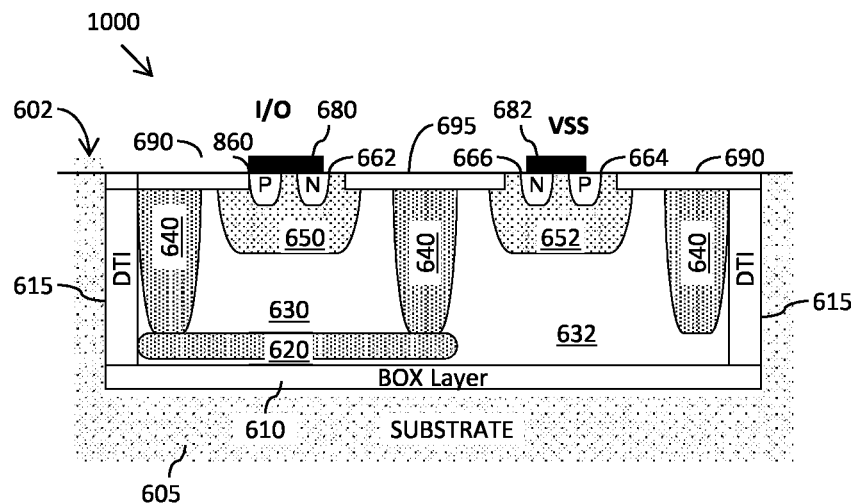
FIG. 10 to FIG. 14 schematically illustrate simplified cross-sectional views of further examples of alternative ESD protection structures within which the present invention has been implemented.
Figure 11:
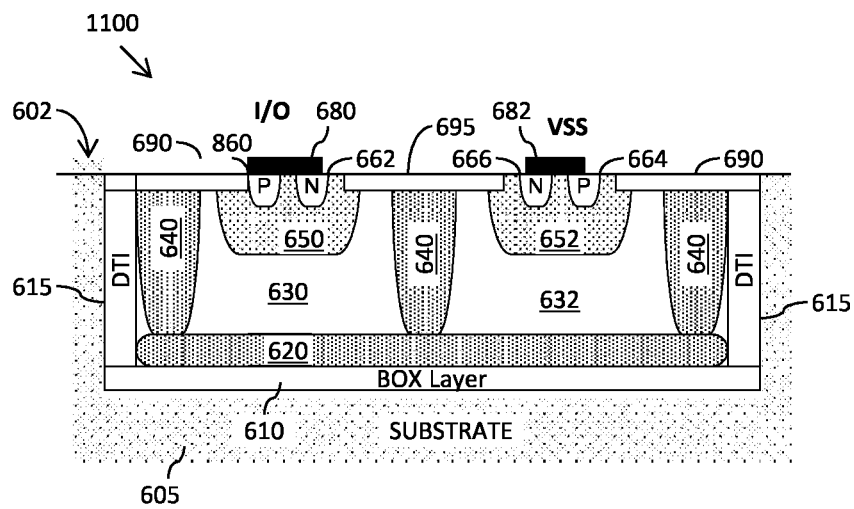

More specifically, FIGS. 10 and 11 illustrate examples of ESD structures 1000, 1100 including only a single P-doped well 652 within the second region 632 of the epitaxial layer (i.e. not including a HVPW 654). Furthermore, in FIG. 11, the ESD structure 1100 includes an NBL 620 extending across substantially the entire width of the ESD structure 1100, isolating the both regions 630, 632 of the epitaxial layer from the BOX layer 610.

Figure 12:
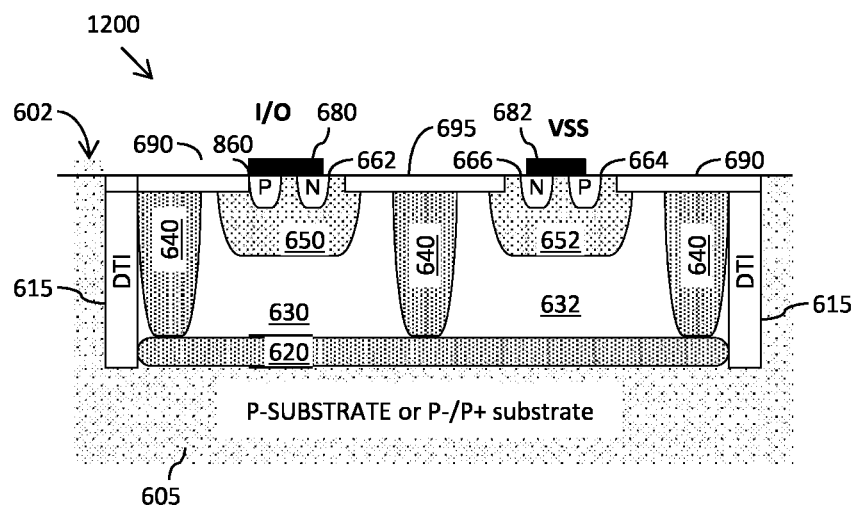
Figure 13:
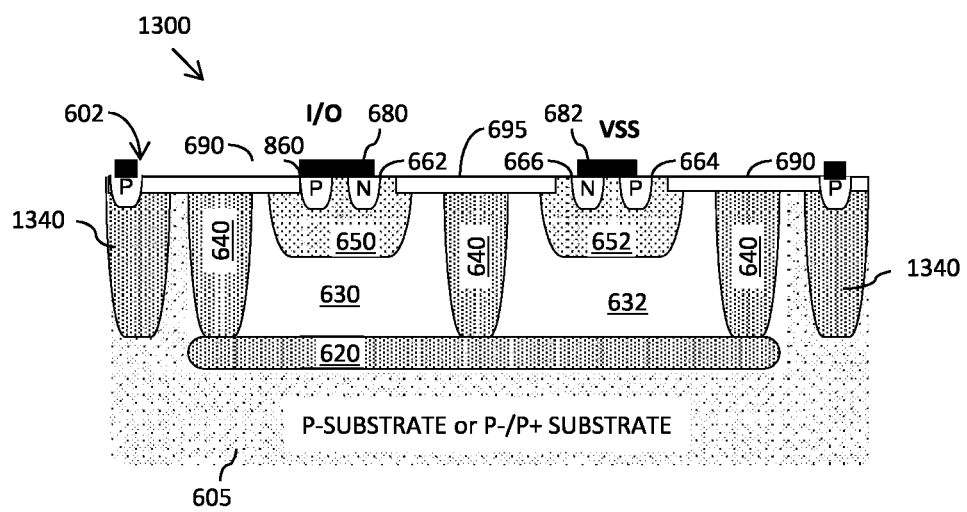

FIGS. 12 and 13 illustrate examples of ESD structures 1200, 1300 whereby vertical (from the cross-section perspective illustrated in FIGS. 12 and 13) isolation between the (P-doped) epitaxial layer and the (P-doped) substrate is provided by the NBL 620 alone, with no BOX layer formed. Notably, no SOI (silicon-isolator-silicon) structure is present for the examples in FIGS. 12 and 13. Furthermore, in FIG. 13 no DTI structures are formed, with lateral isolation between the (P-doped) epitaxial layer and the (P-doped) substrate being provided by the deep N-well structures 640. Additional deep P-well structures 1340 are formed adjacent the deep N-well structures 640.

Figure 14:
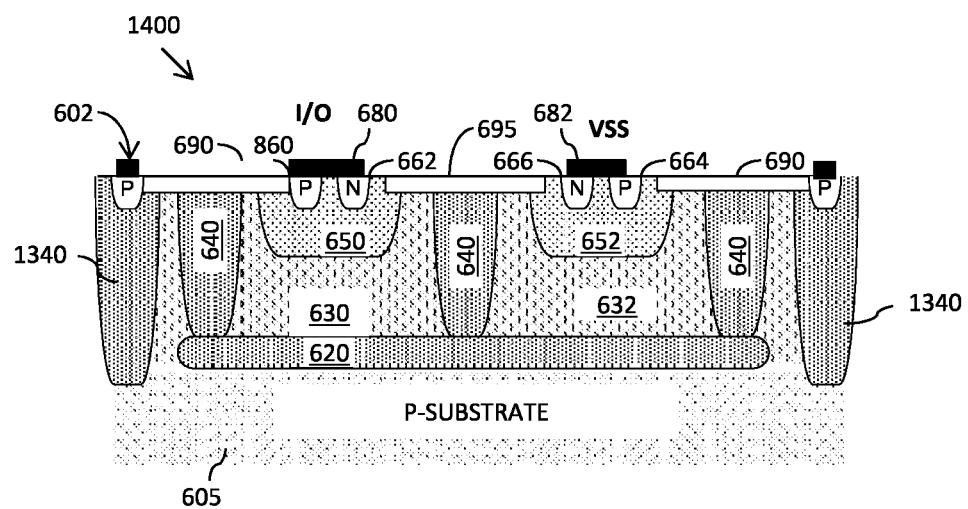

Finally, FIG. 14 illustrates an example of an ESD structure 1400 whereby the ESD structure 1400 includes a N-doped epitaxial layer 630, 632.

The present invention has been described with reference to particular dopant-types; i.e. regions and structures being either P-doped or N-doped. However, it will be appreciated that the present invention is not limited to the particular dopant arrangements hereinbefore described and as illustrated in the accompanying drawings, and in some alternative examples it is contemplated that the dopant types may be reversed. For example, in the illustrated examples regions/structures of a first dopant type have been illustrated and described as being P-doped regions/structures, whilst regions/structures of a second dopant type have been illustrated and described as being N-doped regions/structures. However, it is contemplated that in alternative examples the regions/structures of the first dopant type may alternatively include N-doped regions/structures, and the regions/structures of the second dopant type may alternatively include P-doped regions/structures.

Furthermore, because the illustrated embodiments of the present invention may for the most part, be implemented using fabrication processes and procedures known to those skilled in the art, details of such processes and procedures have not been explained in any greater extent than that considered necessary for the understanding and appreciation of the underlying concepts of the present invention and in order not to obfuscate or distract from the teachings of the present invention.

It is to be understood that the term "or" used herein is to be interpreted either exclusively or inclusively, depending upon which is broader in terms of the context.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The words 'comprising' and 'including' do not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. An electrostatic discharge, ESD, protection structure formed within a semiconductor substrate of an integrated circuit device; the ESD protection structure comprising:
   a first semiconductor region of a first doping type;
   a second semiconductor region of the first doping type;
   a semiconductor structure of a second doping type opposite to the first doping type formed to provide lateral isolation between the first and second semiconductor regions of the first doping type; and
   a first contact region of the second doping type formed within a surface of the second semiconductor region of the first doping type, the surface of the second semiconductor region of the first doping type being co-planar with a surface of the semiconductor substrate;
   a thyristor structure is formed within the ESD protection structure comprising at least:
      the first contact region of the second doping type,
      the second semiconductor region of the first doping type containing the first contact region,
      the semiconductor structure of the second doping type, and the first semiconductor region of the first doping type; and
   wherein no contact region is formed within a surface of the semiconductor structure of the second doping type and no contact region is formed within a surface of the semiconductor structure of the second doping type between the first and second semiconductor regions of the first doping type, said surface of the semiconductor structure of the second doping type being co-planar with the surface of the semiconductor substrate.

2. The ESD protection structure of claim 1, further comprising a shallow trench isolation layer formed over the surface of the semiconductor structure of the second doping type between the first and second semiconductor regions of the first doping type.

3. The ESD protection structure of claim 1, further comprising at least one further contact region of the first doping type formed within a surface of the second semiconductor region of the first doping type, said surface of the second semiconductor region of the first doping type being co-planar with the surface of the semiconductor substrate.

4. The ESD protection structure of claim 3 further comprising a metalized contact layer formed over a contact surface of each of the first and at least one further contact regions.

5. The ESD protection structure of claim 1, wherein the first and second semiconductor regions of the first doping type are formed within an epitaxial layer within the semiconductor substrate.

6. The ESD protection structure of claim 1, further comprising doped wells of the first doping type formed within the surfaces of the first and second semiconductor regions of the first doping type, and the first contact region of the second doping type is formed within a surface of a doped well within the second semiconductor region of the first doping type, said surface of the doped well being co-planar with the surface of the semiconductor substrate.

7. The ESD protection structure of claim 1, further comprising a buried layer of the second doping type formed to isolate the first semiconductor region of the first doping type from a floor of an isolation trench within which the ESD protection structure is contained, whilst permitting contact between the second semiconductor region of the first doping type and the floor of the isolation trench.

8. An integrated circuit device comprising a semiconductor substrate comprising at least one electrostatic discharge, ESD, protection structure formed within the semiconductor substrate; the at least one ESD protection structure comprising:
- a first semiconductor region of a first doping type;
- a second semiconductor region of the first doping type;
- a semiconductor structure of a second doping type opposite to the first doping type formed to provide lateral isolation between the first and second semiconductor regions of the first doping type; and
- a first contact region of the second doping type formed within a surface of the second semiconductor region of the first doping type, the surface of the second semiconductor region of the first doping type being co-planar with a surface of the semiconductor substrate;
- a thyristor structure is formed within the ESD protection structure comprising at least:
  - the first contact region of the second doping type,
  - the second semiconductor region of the first doping type containing the first contact region,
  - the semiconductor structure of the second doping type, and
  - the first semiconductor region of the first doping type; and
- wherein no contact region is formed within a surface of the semiconductor structure of the second doping type and no contact region is formed within a surface of the semiconductor structure of the second doping type between the first and second semiconductor regions of the first doping type, said surface of the semiconductor structure of the second doping type being co-planar with the surface of the semiconductor substrate.

9. The ESD protection structure of claim 8, further comprising a shallow trench isolation layer formed over the surface of the semiconductor structure of the second doping type between the first and second semiconductor regions of the first doping type.

10. The ESD protection structure of claim 8, further comprising at least one further contact region of the first doping type formed within a surface of the second semiconductor region of the first doping type, said surface of the second semiconductor region of the first doping type being co-planar with the surface of the semiconductor substrate.

11. The ESD protection structure of claim 10, further comprising a metalized contact layer formed over a contact surface of each of the first and at least one further contact regions.

12. The ESD protection structure of claim 8, wherein the first and second semiconductor regions of the first doping type are formed within an epitaxial layer within the semiconductor substrate.

13. The ESD protection structure of claim 8, further comprising doped wells of the first doping type formed within the surfaces of the first and second semiconductor regions of the first doping type, and the first contact region of the second doping type is formed within a surface of a doped well within the second semiconductor region of the first doping type, said surface of the doped well being co-planar with the surface of the semiconductor substrate.

14. The ESD protectionstructure of claim 8, further comprising a buried layer of the second doping type formed to isolate the first semiconductor region of the first doping type from a floor of an isolation trench within which the ESD protection structure is contained, whilst permitting contact between the second semiconductor region of the first doping type and the floor of the isolation trench.

* * * * *